United States Patent
Bedell et al.

(10) Patent No.: US 9,679,772 B2
(45) Date of Patent: Jun. 13, 2017

(54) METHOD FOR HANDLING THIN BRITTLE FILMS

(71) Applicants: INTERNATIONAL BUSINESS MACHINES CORPORATION, Armonk, NY (US); AZUR SPACE SOLAR POWER GmbH, Heilbronn (DE)

(72) Inventors: Stephen W. Bedell, Wappingers Falls, NY (US); Tim Kubera, Leingarten (DE); Chérubin Noumissing Sao, Heilbronn (DE)

(73) Assignees: International Business Machines Corporation, Armonk, NY (US); AZUR SPACE SOLAR POWER GMBH, Heilbronn (DE)

( * ) Notice: Subject to any disclaimer, the term of this patent is extended or adjusted under 35 U.S.C. 154(b) by 0 days.

(21) Appl. No.: 14/884,182

(22) Filed: Oct. 15, 2015

(65) Prior Publication Data

US 2017/0110320 A1    Apr. 20, 2017

(51) Int. Cl.
*H01L 21/78* (2006.01)
*H01L 21/18* (2006.01)
*H01L 21/683* (2006.01)
*B32B 38/10* (2006.01)

(52) U.S. Cl.
CPC ............ *H01L 21/187* (2013.01); *B32B 38/10* (2013.01); *H01L 21/6835* (2013.01)

(58) Field of Classification Search
None
See application file for complete search history.

(56) References Cited

U.S. PATENT DOCUMENTS

| 6,238,515 B1 | 5/2001 | Tsujimoto et al. |
| 6,921,707 B1 | 7/2005 | Zinn et al. |
| 7,232,740 B1 | 6/2007 | Mountain |
| 8,247,261 B2 | 8/2012 | Bedell et al. |
| 8,709,914 B2 | 4/2014 | Bedell et al. |

(Continued)

FOREIGN PATENT DOCUMENTS

| JP | 59-121953 A | 7/1984 |
| JP | 59-121953 U | 8/1984 |

(Continued)

OTHER PUBLICATIONS

Thorton, J. et al., "Internal stresses in titanium, nickel, molybdenum, and tantalum films deposited by cylindrical magnetron sputtering", J. Vac. Sci. Technol., vol. 14, No. 1 (1977) pp. 164-168.

*Primary Examiner* — Khaja Ahmad
(74) *Attorney, Agent, or Firm* — Scully, Scott, Murphy & Presser, P.C.; Louis J. Percello, Esq.

(57) ABSTRACT

A method including: providing a structure comprising: a spalled layer having a first side and a second side; and a tape layer provided on the first side of the spalled layer, wherein the tape layer is provided at below a first temperature range; applying a temporary substrate layer to the second side of the spalled layer, wherein the temporary substrate layer is applied at a second temperature range, and wherein at least a portion of the second temperature range is lower than the first temperature range; and after applying the temporary substrate layer, separating the tape layer from the spalled layer.

16 Claims, 5 Drawing Sheets

(56) References Cited

U.S. PATENT DOCUMENTS

| | | |
|---|---|---|
| 8,709,957 B2 | 4/2014 | Bedell et al. |
| 8,778,737 B2 | 7/2014 | Cooney, III et al. |
| 8,936,961 B2 | 1/2015 | Bedell et al. |
| 2007/0017438 A1 | 1/2007 | Xie et al. |
| 2010/0307572 A1 | 12/2010 | Bedell et al. |
| 2012/0217622 A1 | 8/2012 | Bedell et al. |
| 2012/0322230 A1* | 12/2012 | Bedell ................ H01L 21/7813 438/460 |
| 2013/0316538 A1 | 11/2013 | Bedell et al. |
| 2014/0001152 A1 | 1/2014 | Zurutuza Elorza et al. |

FOREIGN PATENT DOCUMENTS

| | | |
|---|---|---|
| JP | 2014-45145 A | 3/2014 |
| JP | 2014-49486 A | 3/2014 |
| JP | 5433542 B2 | 3/2014 |
| JP | 2014-67873 A | 4/2014 |
| JP | 2014-067944 A | 4/2014 |

\* cited by examiner

Wrinkled shape of spalled layer

METHOD FOR HANDLING THIN BRITTLE FILMS

BACKGROUND

This disclosure relates generally to the field of semiconductor device manufacturing, and more particularly, to a method for providing a spalled layer to a target substrate layer.

Devices such as, for example, photovoltaic devices and electro-optical devices, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Pat. No. 8,247,261 B2 to Bedell et al., of a novel layer transfer method referred to as "controlled spalling technology" has permitted the fabrication of low-cost, thin-film, high quality substrates by removing a surface layer from a base substrate. The thin-film substrate layers that can be removed by this controlled spalling technology can be used to 1) decrease the cost per Watt value of conventional photovoltaic technology or 2) permit fabrication of novel, high-efficiency photovoltaic, electronic and opto-electronic materials that are flexible and can be used to produce new products.

SUMMARY

The present disclosure relates to a method for providing a spalled layer to a target substrate layer. The method comprises providing a structure comprising a spalled layer having a first side and a second side; and a tape layer provided on the first side of the spalled layer, wherein the tape layer is provided below a first temperature range. The method further comprises applying a temporary substrate layer to the second side of the spalled layer, wherein the temporary substrate layer is applied at a second temperature range, and wherein at least a portion of the second temperature range is lower than the first temperature range. The method further comprises, after applying the temporary substrate layer, separating the tape layer from the spalled layer.

BRIEF DESCRIPTION OF SEVERAL VIEWS OF THE DRAWINGS

FIG. 6 shows an example of the structure of FIG. 4C. Specifically.

DETAILED DESCRIPTION

The present disclosure, which discloses methods for providing a brittle spalled layer on a target substrate, will now be described in greater detail by referring to the following discussion and drawings that accompany the present application.

It is noted that the drawings of the present application are provided for illustrative purposes and, as such, they are not drawn to scale.

It is further noted that in the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

It is further noted that in the following description, like elements are referred to by like reference numerals. For purposes of the description hereinafter, the terms "upper", "lower", "top", "bottom", and derivatives thereof shall relate to the components, layers and/or elements as oriented in the drawing of the present application.

It is further noted that in the following description, when an element as a layer, region or substrate is referred to as being "on" or "over" another element, it can be directly on the other element or intervening elements may also be present. In contrast, when an element is referred to as being "directly on" or "directly over" another element, there are no intervening elements present.

It is further noted that when an element is referred to as being "provided" on another element, it can be directly provided on the other element or intervening elements may be present. In contrast, when an element is referred to as being "directly provided" on another element, there are no intervening elements present.

Figure 1A:
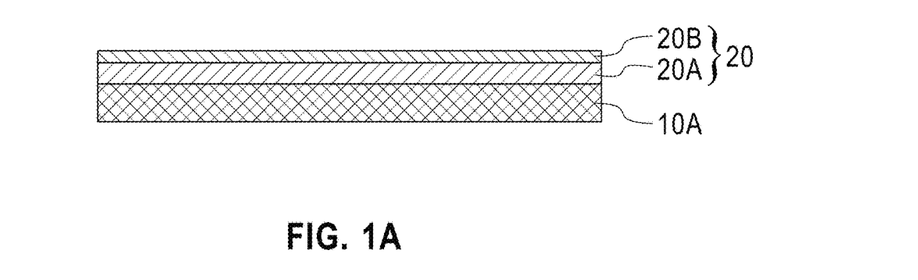
FIG. 1A illustrates a structure formed after a spalling process, wherein the structure comprises a spalled layer formed by a spalling technique and a tape layer provided on a first side of the spalled layer.

Referring to FIG. 1A, there is illustrated a structure formed after a spalling process. The structure of FIG. 1A comprises a spalled layer 10A and a tape layer 20 provided on a first side of the spalled layer 10A. The tape layer 20 comprises a tape adhesive layer 20A provided on the first side of the spalled layer 10A and a tape base layer 20B provided on the tape adhesive layer 20A. Examples of the tape layer 20 include Nitto Denko 3193MS thermal release tape, Kapton KPT-1, and Diversified Biotech's CLEAR-170 (acrylic adhesive, vinyl base).

Figure 1B:
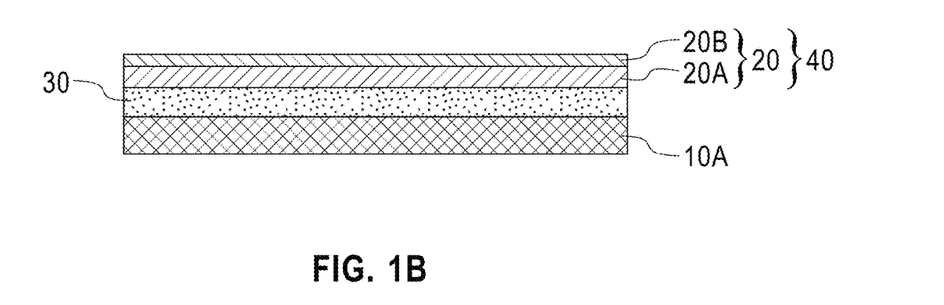
FIG. 1B illustrates a first example of the structure of FIG. 1A. The structure of FIG. 1B comprises a stressor layer and a handle layer, wherein the handle layer comprises a tape layer.

Referring to FIG. 1B, there is illustrated a first example of the structure of FIG. 1A. The structure of FIG. 1B comprises the spalled layer 10A, a stressor layer 30 provided on the first side of the spalled layer 10A, and a handle layer 40 provided on the stressor layer 30. In the structure of FIG. 1B, the handle layer 40 comprises the tape layer 20 illustrated in FIG. 1A, wherein the tape layer 20 comprises the tape adhesive layer 20A provided on the first side of the spalled layer 10A and the tape base layer 20B provided on the tape adhesive layer 20A.

Figure 1C:
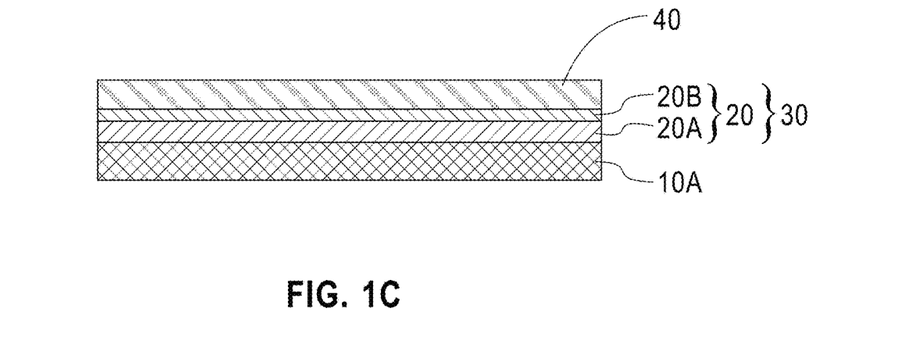
FIG. 1C illustrates a second example of the structure of FIG. 1A. The structure of FIG. 1C comprises a stressor layer, wherein the stressor layer comprises a tape layer.

Referring to FIG. 1C, there is illustrated a second example of the structure of FIG. 1A. The structure of FIG. 1C comprises the spalled layer 10A, the stressor layer 30 provided on the first side of the spalled layer 10A, and the handle layer 40 provided on the stressor layer 30. In the structure of FIG. 1C, the stressor layer 30 comprises the tape layer 20, wherein the tape layer 20 comprises the tape adhesive layer 20A provided on the first side of the spalled layer 10A and the tape base layer 20B provided on the tape adhesive layer 20A.

Techniques for forming the spalled layer 10A will be described further below. Spalling is a unique mode of brittle fracture whereby a tensile surface layer induces fracture parallel and below a film/substrate interface. The origin of this effect lies in the combination of normal stress (mode I) and shear stress (mode II). The use of spalling mode fracture for layer transfer exploits thermal effects. Specifically, spalling mode fracture takes advantage of the coefficient of thermal expansion (CTE) differences between a brittle substrate and a film to induce the necessary tensile stress to satisfy the spalling mode fracture and therefore create a fracture parallel to the film/substrate interface at a depth within the brittle substrate.

In the structures of FIGS. 1A-1C, one or more intervening layers can be provided between the spalled layer 10A and the stressor layer 30. Further, one or more intervening layers can be provided between the stressor layer 30 and the handle layer 40. Non-limiting examples of the one or more intervening layers will be described in detail further below.

Next, a conventional technique for handling the structures of FIGS. 1A-1C will be described.

Figure 2A:
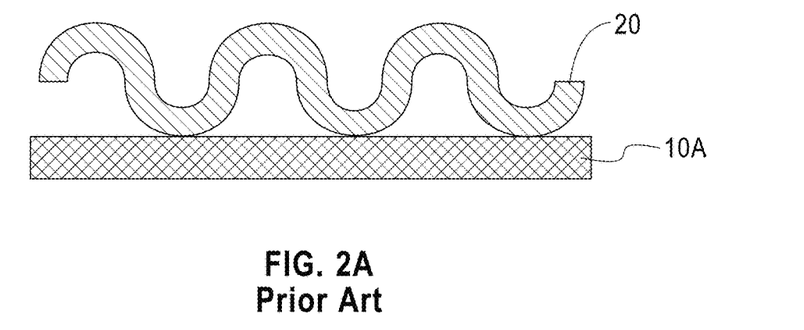
FIG. 2A illustrates a conventional structure comprising a spalled layer and a tape layer following a process of heating the conventional structure in preparation for bonding of the spalled layer to a target substrate, wherein at least a portion of the tape layer exhibits a wrinkled shape relative to a shape of the at least a portion of the tape layer prior to heating.

Referring to FIG. 2A, there is illustrated a conventional structure comprising the spalled layer 10A and the tape layer 20 following a process of heating the structure of FIG. 1A in preparation for bonding the spalled layer 10A to a target substrate, wherein a least a portion of the tape layer 20 exhibits a wrinkled shape relative to a shape of the at least a portion of the tape layer 20 prior to heating.

It has come to the attention of the inventors of the subject application that the process of heating the structure of FIG. 1A correlates to at least a portion of the tape layer 20 exhibiting a wrinkled shape relative to a shape of the at least a portion of the tape layer 20 prior to heating.

While not wishing to be bound to a particular theory, it is believed that the process of heating the structure of FIG. 1A leads to wrinkling of the tape layer 20 due to: (1) the higher CTE of the tape layer 20; and (2) weakening of the tape adhesive layer 20A, thus allowing slippage between the tape layer 20 and the spalled layer 10A.

While again not wishing to be bound to a particular theory, it is believed that during the process of heating the structure of FIG. 1B, at least a portion of the tape layer 20 elongates and wrinkles with respect to the stressor layer 30 and with respect to the spalled layer 10A.

Figure 2B:
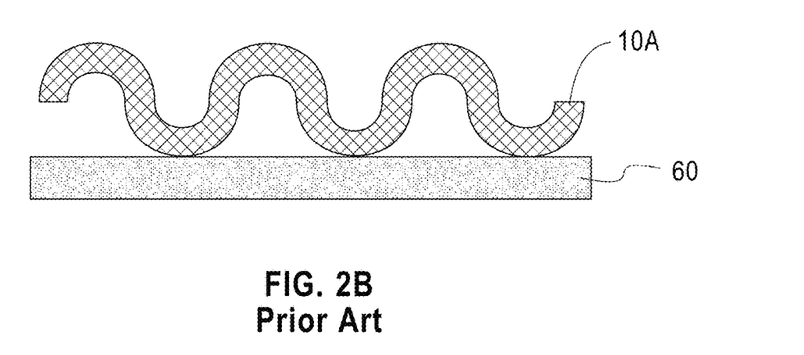
FIG. 2B illustrates a conventional structure resulting from bonding the spalled layer of the heated conventional structure of FIG. 2A to a target substrate, and removing the tape layer from the spalled layer.

Referring to FIG. 2B, there is illustrated a conventional structure resulting from bonding the spalled layer 10A of the conventional structure of FIG. 2A to a target substrate 60, and removing the tape layer 20 from the spalled layer 10A. In the conventional structure of FIG. 2B, at least a portion of the spalled layer 10A exhibits a wrinkled shape corresponding to a shape of the at least a portion of the tape layer 20 prior to bonding of the spalled layer 10A to the target substrate 60. Specifically, the wrinkled shape of the at least a portion of the spalled layer 10A corresponds to the wrinkled shape of the at least a portion of the tape layer 20 in the conventional structure of FIG. 2A.

Figure 5:
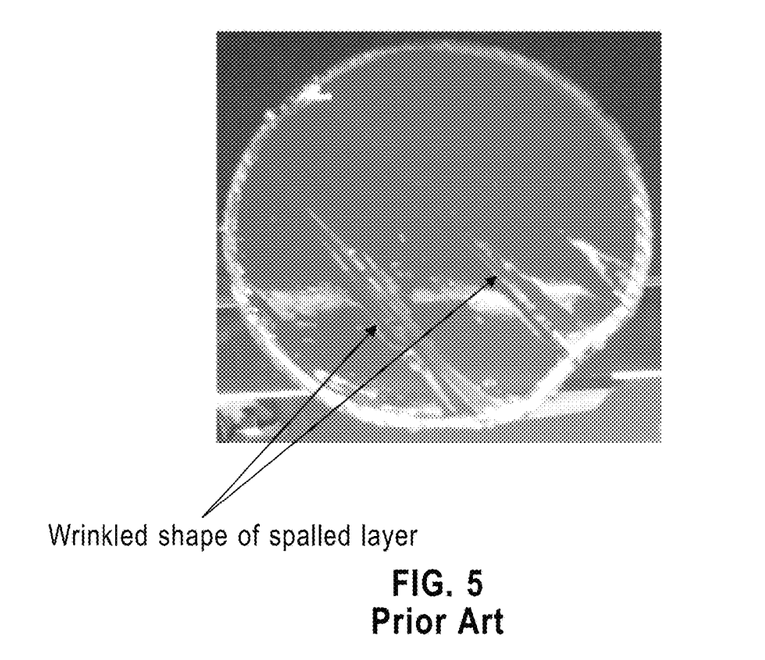
FIG. 5 shows an example of the conventional structure of FIG. 2B wherein at least a portion of the spalled layer 10A exhibits a wrinkled shape.

Referring to FIG. 5, there is shown an example of the conventional structure of FIG. 2B wherein at least a portion of the spalled layer 10A exhibits a wrinkled shape.

It has further come to the attention of the inventors of the subject application that the process of bonding the conventional structure of FIG. 2A to the target substrate 60 correlates to at least a portion of the spalled layer 10A exhibiting a wrinkled shape corresponding to a shape of the at least a portion of the tape layer 20 prior to bonding.

While again not wishing to be bound to a particular theory, it is believed that the wrinkled shape of the at least a portion of the tape layer 20 in the conventional structure of FIG. 2A is transferred to the spalled layer 10A during bonding of the spalled layer 10A to the target substrate 60.

Next, techniques for reducing or eliminating the formation of the wrinkled shape in the at least a portion of the spalled layer 10A of the conventional structure of FIGS. 2B and 5 will be described.

To reduce or eliminate the formation of the wrinkled shape in the at least a portion of the spalled layer 10A of the conventional structure of FIGS. 2B and 5, a temporary substrate is provided to the second side of the spalled layer 10A, wherein the second side of the spalled layer 10A is one or more sides of the spalled layer 10A that is different from the first side of the spalled layer 10A.

The second side of the spalled layer 10A can be selected such that the temporary substrate provided thereon mechanically supports the spalled layer 10A. For example, the temporary substrate can be provided to a second side of the spalled layer 10A substantially opposite to the first side of the spalled layer 10A. In another example, the temporary substrate can be provided to a second side of the spalled layer 10A substantially perpendicular to the first side of the spalled layer 10A.

Figure 3:
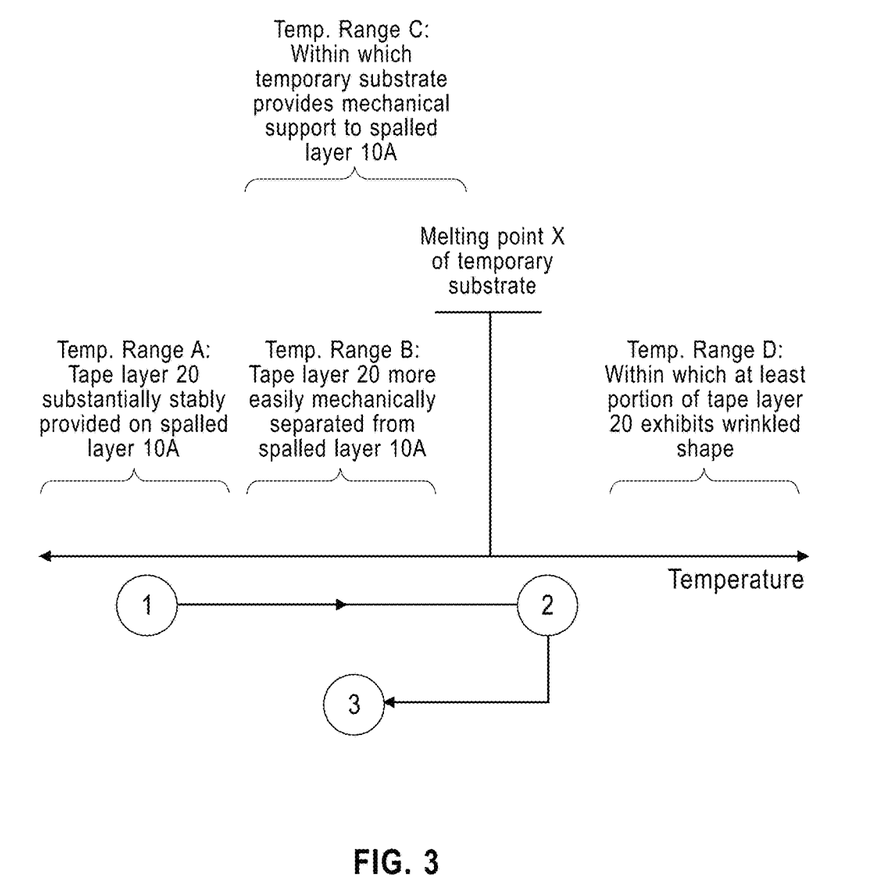
FIG. 3 illustrates temperature characteristics related to the tape layer (temperature ranges A, B and D) and a temporary substrate (temperature range C and melting point X) provided to the spalled layer.

Referring to FIG. 3, characteristics of the temporary substrate will be described.

FIG. 3 illustrates: (i) a temperature range A at which the tape layer 20 is substantially stably provided on the first side of the spalled layer 10A; and (ii) a temperature range B that is different from the temperature range A, wherein the tape layer 20 is more easily mechanically separated from the spalled layer 10A in the temperature range B than in the temperature range A, and wherein the temperature range B includes a temperature that is higher than a maximum temperature in the temperature range A.

FIG. 3 further illustrates: (iii) a melting point X of the temporary substrate; and (iv) a temperature range (C) below the melting point X, wherein the temporary substrate that is applied to the second side of the spalled layer 10A provides mechanical support to the spalled layer 10A at the temperature range (C).

FIG. 3 further illustrates: (v) a temperature range D within which at least a portion of the tape layer 10A exhibits a wrinkled shape, wherein the melting point X of the temporary substrate is less than a minimum temperature in the temperature range D.

Next, exemplary process steps for handling the spalled layer 10A and removing the tape layer 20 will be described.

Referring to FIGS. 3 and 1A, in an initial step (1), the structure of FIG. 1A is provided.

Figure 4A:
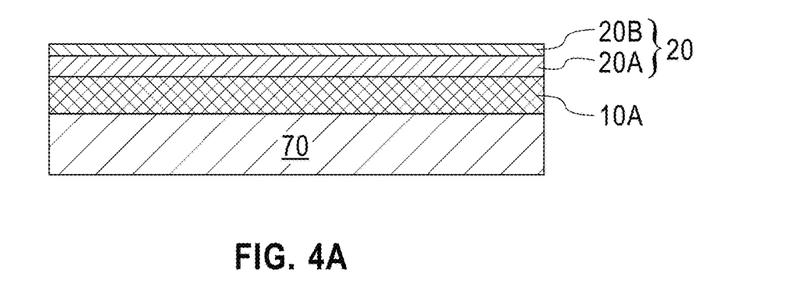
FIG. 4A illustrates a structure comprising the structure of FIG. 1A and a temporary substrate provided on the second side of the spalled layer.

Referring to FIGS. 3 and 4A, there is illustrated a subsequent step (2) in which a structure comprising the structure of FIG. 1A and a temporary substrate 70 provided on the second side of the spalled layer 10A is provided. The temporary substrate 70 is provided to the second side of the spalled layer 10A by heating at least the temporary substrate 70, or the temporary substrate 70 and the spalled layer 10A, or the structure of FIG. 1A from the temperature range A (wherein the tape layer 20 is substantially stably provided on the spalled layer 10A) to at least the melting point X, but below temperature range D, and then providing the temporary substrate 70 to the second side of the spalled layer 10A. The temporary substrate 70 can be provided to the second side of the spalled layer 10A by techniques such as direct mechanical application, spin coating or screen printing.

Although not illustrated, one of skill in the art will understand that the temporary substrate 70 can be similarly provided to the second side of the spalled layer 10A of the structures of FIGS. 1B and 1C.

Referring to FIGS. 3 and 4A, it is noted that the temporary substrate 70 is applied to the spalled layer 10A at a temperature range that includes the melting point X, but is below the minimum temperature of the temperature range D at which at least a portion of the tape layer 20 exhibits a wrinkled shape. Thus, the tape layer 20 will not exhibit the wrinkled shape in at least a portion thereof during application of the temporary substrate 70 to the second side of the spalled layer 10A.

Referring to FIGS. 3 and 4A, it is also contemplated that the temporary substrate 70 is provided to the spalled layer at a temperature range that includes the melting point X and a lower temperature portion of the temperature range D such that at least a portion of the tape layer 20 exhibits a wrinkled shape that is less than a predetermined quantity.

Figure 4B:
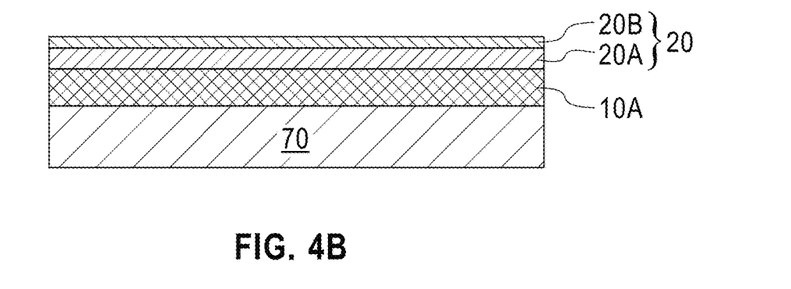
FIG. 4B illustrates the structure of FIG. 4A that is cooled down to a temperature range within the temperature range C at which the temporary substrate provides mechanical support to the spalled layer and also within the temperature range B within which the tape layer is more easily mechanically separated from the spalled layer than within the temperature range A.

Referring to FIGS. 3 and 4B, there is illustrated a subsequent step (3) in which the structure of FIG. 4A that is cooled down to a temperature range within the temperature range C at which the temporary substrate 70 provides mechanical support to the spalled layer 10A and also within the temperature range B within which the tape layer 20 is more easily mechanically separated from the spalled layer 10A than within the temperature range A.

Referring to the structure of FIG. 4B, the temporary substrate 70 provides mechanical support to the spalled layer 10A while permitting the mechanical separation of the tape layer 20 within the temperature range B within which the tape layer 20 is more easily mechanically separated from the spalled layer 10A than within the temperature range A.

Figure 4C:
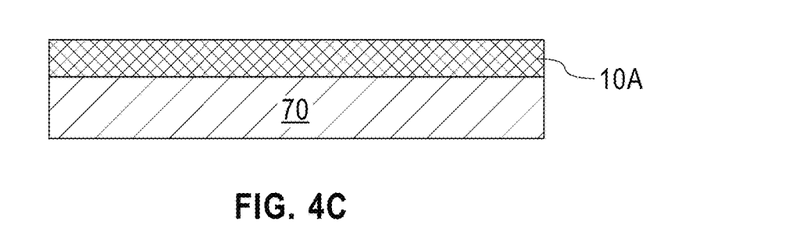
FIG. 4C illustrates a structure comprising the spalled layer and the temporary substrate provided on the second side of the spalled layer following mechanical separation of the tape layer from the spalled layer at the temperature range provided to the structure of FIG. 4B.

Referring to FIG. 4C, there is illustrated a structure comprising the spalled layer 10A and the temporary substrate 70 provided on the second side of the spalled layer 10A following mechanical separation of the tape layer 20 from the spalled layer 10A at the temperature range provided to the structure of FIG. 4B.

Figure 6:
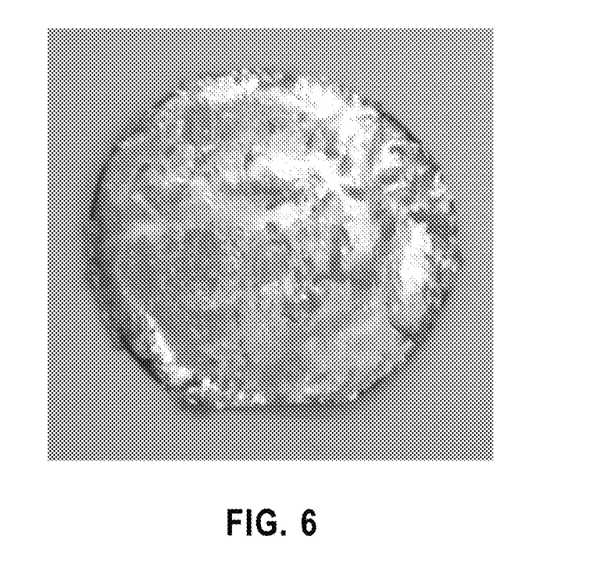
FIG. 6 shows a spalled Si layer with solder (S-Bond 220) acting as a temporary substrate, wherein the tape layer has been successfully removed, and wherein formation of the wrinkled shape in at least a portion of the spalled layer is reduced or eliminated.

Referring to FIG. 6, there is shown an example of the structure of FIG. 4C. Specifically, FIG. 6 shows a spalled Si layer 10A with solder (S-Bond 220) acting as a temporary substrate 70, wherein the tape layer 20 has been successfully removed, and wherein formation of the wrinkled shape in at least a portion of the spalled layer 10A is reduced or eliminated.

Figure 4D:
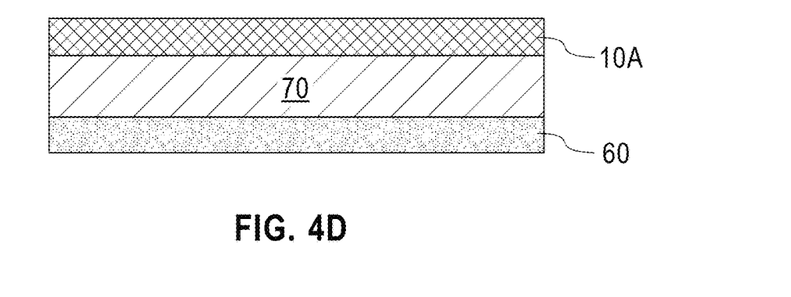
FIG. 4D illustrates a structure comprising the spalled layer that is bonded directly or indirectly to a target substrate following removal of the tape layer.

Referring to FIG. 4D, there is illustrated a structure comprising the spalled layer 10A that is bonded directly or indirectly to the target substrate 60 following removal of the tape layer 20. Any bonding process well known to those skilled in the art can be used to provide the structure of FIG. 4D. The target substrate 60 may be flexible or non-flexible. In some embodiments, the target substrate 60 may be comprised of a semiconductor material. In other embodiments, the target substrate 60 may be comprised of a dielectric material.

In the above-described techniques, the temperature range A can have a maximum temperature of approximately 130 degrees Celsius, the temperature range B can be from approximately 140 degrees Celsius to 200 degrees Celsius, the temperature range C can be from 130 degrees Celsius to 200 degrees Celsius, the melting point of the temporary substrate 70 can be from approximately 150 degrees Celsius to approximately 230 degrees Celsius, and the temperature range D can have a minimum temperature of approximately 250 degrees Celsius.

In the above-described techniques, the temporary substrate 70 can be a low temperature solder. The low temperature solder can comprise one of: tin-silver-titanium (Sn—Ag—Ti) (example, S-Bond® 220) and gold-tin (AuSn). In general, any material that remains solid at the temperature which permits removal of the tape layer 20 is contemplated. This can include In, In-alloys, Sn, Sn-alloys (such as S-Bond and similar alloys), Pb and Pb-based alloys, alone or in combinations thereof. The temperature at which silicone-adhesive based tape layers can be more easily mechanically removed is approximately 140 degrees Celsius and greater.

Techniques for providing the structures of FIGS. 1A-1C will be described in further detail below.

The techniques for providing the structures of FIGS. 1A-1C can begin with providing a base substrate. The base substrate has a first surface (i.e., topmost surface) and a second surface (i.e., bottommost surface) that is opposite the first surface.

The base substrate may comprise a semiconductor material, a glass, a ceramic or any another material or combination of materials whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate comprises a semiconductor material, the semiconductor material may comprise Si, Ge, SiGe, SiGeC, SiC, Ge alloys, compounds semiconductor such as, for example III-V compound semiconductors or II-VI compound semiconductor. In some embodiments, the base substrate can be a III-V compound semiconductor such as, for example, GaSb, GaP, GaN, GaAs, InAs, InP, InAsP and AN. In some embodiments, the base substrate is a bulk semiconductor material. In other embodiments, the base substrate may comprise a layered semiconductor material such as, for example, a semiconductor-on-insulator or a semiconductor on a polymeric substrate. Examples of semiconductor-on-insulator substrates that can be employed as the base substrate include silicon-on-insulators and silicon-germanium-on-insulators. In some embodiments, the base substrate comprises a multilayered stack of semiconductor materials. An example of such a base substrate is a multilayered stack of from bottom to top, a layer of germanium, and a layer of gallium arsenide. When the base substrate comprises a semiconductor material, the semiconductor material can be doped, undoped or contain doped regions and undoped regions.

In one embodiment, the semiconductor material that can be employed as the base substrate can be single crystalline (i.e., a material in which the crystal lattice of the entire sample is continuous and unbroken to the edges of the sample, with no grain boundaries). In another embodiment, the semiconductor material that can be employed as the base substrate can be polycrystalline (i.e., a material that is composed of many crystallites of varying size and orientation; the variation in direction can be random (called random texture) or directed, possibly due to growth and processing conditions). In yet another embodiment, the semiconductor material that can be employed as the base substrate can be amorphous (i.e., a non-crystalline material that lacks the long-range order characteristic of a crystal). Typically, the semiconductor material that can be employed as the base substrate is a single crystalline material.

When the base substrate comprises a glass, the glass can be a $SiO_2$-based glass which may be undoped or doped with an appropriate dopant. Examples of $SiO_2$-based glasses that can be employed as the base substrate comprise undoped silicate glass, borosilicate glass, phosphosilicate glass, fluorosilicate glass, and borophosphosilicate glass.

When the base substrate comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

One or more devices including, but not limited to, transistors, capacitors, diodes, BiCMOS, resistors, etc. can be processed on and/or within the base substrate. The one or more devices can be arranged in the spalled layer 10A to be spalled from the base substrate. In some embodiments, the spalled layer 10A to be spalled from the base substrate may also include one or more III-V compound semiconductor layers which can be used as a photovoltaic device.

The first surface of the base substrate can be cleaned prior to further processing to remove surface oxides and/or other contaminants therefrom. The first surface of the base substrate can be cleaned by applying to the first surface of the base substrate a solvent such as, for example, acetone and isopropanol, which is capable of removing contaminates and/or surface oxides from the first surface of the base substrate.

The first surface of the base substrate can be made hydrophobic by oxide removal prior to use by dipping the first surface of the base substrate into hydrofluoric acid. A hydrophobic, or non-oxide, surface provides improved adhesion between the cleaned surface and certain stressor layers to be deposited.

Next, a structure comprising an optional metal-containing adhesion layer provided on the first surface of the base substrate layer is formed.

The optional metal-containing adhesion layer is employed in embodiments in which the stressor layer to be subsequently formed has poor adhesion to the first surface of the base substrate layer. In some embodiments, the metal-containing adhesion layer is employed when a stressor layer comprised of a metal is employed. In other embodiments, an optional plating seed layer (not shown) can be formed directly atop the first surface of the base substrate. The optional plating seed layer can be used together with the metal-containing adhesion layer or in lieu thereof. When used together with the metal-containing adhesion layer, the plating seed layer is formed on an exposed surface of the metal-containing adhesion layer.

The optional metal-containing adhesion layer that can be employed in the present application comprises any metal adhesion material such as, but not limited to, Ti/W, Ti, Cr, Ni or any combination thereof. The optional metal-containing adhesion layer may comprise a single layer or it may comprise a multilayered structure comprising at least two layers of different metal adhesion materials.

When present, the optional metal-containing adhesion layer can be formed at a temperature from 15° C. to 40° C., i.e., 288K to 313K, or above. In one embodiment, the optional metal-containing adhesion layer can be formed at a temperature which is from 20° C. (293K) to 180° C. (353K). In another embodiment, the optional metal-containing adhesion layer can be formed at a temperature which is from 20° C. (293K) to 60° C. (333K).

The metal-containing adhesion layer, which may be optionally employed, can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the optional metal-containing adhesion layer typically has a thickness from 5 nm to 300 nm, with a thickness from 100 nm to 150 nm being more typical. Other thicknesses for the optional metal-containing adhesion layer that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al (bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

The optional metal-containing adhesion layer and/or the optional plating seed layer is (are) formed at a temperature which does not effectuate spontaneous spalling to occur within the base substrate.

Next, a structure comprising the stressor layer 30 on an upper surface of the optional metal-containing adhesion layer is provided. In some embodiments in which the optional metal-containing adhesion layer is not present, the stressor layer 30 can be formed directly on the first surface of the base substrate. In other embodiments in which an optional plating seed layer is employed, the stressor layer 30 can be formed directly on the upper surface of the optional plating seed layer. In yet further embodiments of the present application, the stressor layer 30 can be omitted.

The stressor layer 30 that can be employed in the present application includes any material that is under tensile stress on the base substrate after deposition. The stressor layer 30 can also be referred to a stress inducing layer. In accordance with the present application, the stressor layer 30 has a critical thickness and a stress value that cause spalling mode fracture to occur within the base substrate. In particular, the stressor layer 30 has a critical thickness in which spalling is initiated below the first surface of the base substrate and somewhere within the base substrate. By "critical", it is meant that for a given stressor material and base substrate material combination, a thickness value and a stressor value for the stressor layer 30 is chosen that render spalling mode fracture possible (can produce a $K_I$ value greater than the $K_{IC}$ of the substrate). The stress value can be adjusted by tuning the deposition conditions of the stressor layer 30. For example, in the case of sputter deposition of the stressor layer 30, the gas pressure can be used to tune the stress value as described in Thorton and Hoffman, *J. Vac. Sci. Technol.*, 14 (1977) p. 164.

The thickness of the stressor layer 30 is chosen to provide the desired fracture depth somewhere within the base substrate. For example, if the stressor layer 30 is chosen to be Ni, then fracture will occur at a depth below the stressor layer 30 roughly 2 to 3 times the Ni thickness. The stress value for the stressor layer 30 is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the base substrate and thus can be employed as the stressor layer 30 include, but are not limited to, a metal, a polymer, such as a spall inducing tape layer 20, or any combination thereof. The stressor layer 30 may comprise a single stressor layer, or a multilayered stressor structure including at least two layers of different stressor material can be employed.

In one embodiment, the stressor layer 30 is a metal, and the metal is formed on an upper surface of the optional metal-containing adhesion layer. In another embodiment, the stressor layer 30 comprises the tape layer 20, and the spall inducing tape layer 20 is applied directly to the first surface of the base substrate. In another embodiment, for example, the stressor layer 30 may comprise a two-part stressor layer including a lower part and an upper part. The upper part of the two-part stressor layer can be comprised of the spall inducing tape layer 20.

When a metal is employed as the stressor layer 30, the metal can include, for example, Ni, Cr, Fe, Mo, Ti or W. Alloys of these metals can also be employed. In one embodiment, the stressor layer 30 includes at least one layer consisting of Ni.

When a polymer is employed as the stressor layer 30, the polymer is a large macromolecule composed of repeating structural units. These subunits are typically connected by covalent chemical bonds. Illustrative examples of polymers that can be employed as the stressor layer 30 include, but are not limited to, polyimides polyesters, polyolefins, polyacrylates, polyurethane, polyvinyl acetate, or polyvinyl chloride.

When a spall inducing non-metallic layer (i.e. polymeric materials such as the tape layer 20) is employed as the stressor layer 30, the spall inducing layer includes any pressure sensitive tape that is flexible, soft, and stress free at a first temperature used to form the tape, yet strong, ductile and tensile at a second temperature used during removal, i.e., spalling of an upper portion of the base substrate 30. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate (with a lower CTE) and the tape layer 20 (with a higher CTE).

Typically, the pressure sensitive tape that is employed in the present application as the stressor layer 50 includes at least a tape adhesive layer and a tape base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 30 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 30 is a metal or polymer, the stressor layer 30 can be formed utilizing deposition techniques including, for example, dip coating, spin-coating, brush coating, sputtering, chemical vapor deposition, plasma enhanced chemical vapor deposition, chemical solution deposition, physical vapor deposition, or plating.

When the stressor layer 30 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 30 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the first surface of the base substrate, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 30 is of a metallic nature, it typically has a thickness of from 1 µm to 50 µm, with a thickness of from 4 µm to 7 µm being more typical. Other thicknesses for the stressor layer 30 that are below and/or above the aforementioned thickness ranges can also be employed in the present application.

If the stressor layer 30 is of a polymeric nature, it typically has a thickness of from 10 µm to 200 µm, with a thickness of from 50 µm to 100 µm being more typical. Other thicknesses for the stressor layer 30 that are below and/or above the aforementioned thickness ranges can also be employed in the present application.

Next, a structure comprising the handle layer 40 provided atop the stressor layer 30 is formed. In some embodiments of the present application, the handle layer 40 can be omitted. The material that provides the handle layer 40 of the present application can include any flexible material which has a minimum radius of curvature of less than 30 cm. Illustrative examples of flexible materials that can be employed as the handle layer 40 include a metal foil, a polyimide foil or the tape layer 20.

The handle layer 40 can be used to provide better fracture control and more versatility in handling the spalled layer 10A of the base substrate. Moreover, the handle substrate 24 can be used to guide the crack propagation during the spalling process of the present application. The handle layer 40 of the present application is typically, but not necessarily, formed at a first temperature which is at room temperature (15° C. (288K)-40° C. (313K)).

The handle layer 40 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, or plating.

The handle layer 40 typical has a thickness of from 5 µm to 500 µm, with a thickness of from 10 µm to 150 µm being more typical. Other thicknesses for the handle layer 40 that are below and/or above the aforementioned thickness ranges can also be employed in the present application.

The handle layer 40 typically has a length that extends beyond the length of the base substrate. As such, it is possible to process multiple base substrates utilizing a single handle layer 40.

Next, a structure formed after removing an upper portion (which is the spalled layer 10A) of the base substrate by spalling is described. In one embodiment of the present application, the spalling process also includes pulling or peeling the handle layer 40 to remove a spalled structure that includes at least the intermetallic layer and an upper portion of the base substrate. The upper portion of the base substrate that is removed by spalling from the original base substrate 10 is the spalled layer 10A of the structures of FIGS. 1A-1C. The remaining portion of the original base substrate may be referred to herein as remaining base substrate portion.

As mentioned above, the spalling process includes crack formation within the base substrate that is initiated by first inducing the solid state reaction mentioned above. In one embodiment, the formation of the intermetallic compound layer is initiated by applying heat energy from an external heat source to the structure including the reactive material stack. In one embodiment of the present application, the external heat source can heat the structure including the reactive material stack to a temperature from 200° C. to 500° C. Other temperatures that are lesser than or greater than the aforementioned temperature range can be used as long as the selected temperatures initiates the solid state reaction and formation of the intermetallic compound layer.

Next, techniques for handling and processing the structures of FIGS. 4C and 4D is described. The structures of FIGS. 4C and 4D can be further processed to remove one or more of the intervening layers between the tape layer 20 and the spalled layer 10A. Specifically, techniques known to one of skill in the art can be employed to remove one or more of the intermetallic compound layer, the dielectric layer, the stressor layer 30, the metal-containing adhesion layer and the plating seed layer.

The various materials (i.e., any of the handle layer 40, the dielectric layer, the stressor layer 30, the plating seed layer, and the metal-containing adhesion layer) can be removed utilizing conventional techniques well known to those skilled in the art. For example, and in one embodiment, aqua regia ($HNO_3$/HCl) can be used for removing the handle substrate 40, the stressor layer 30, the plating seed layer, and the metal-containing adhesion layer. In another example, UV or heat treatment is used to remove the handle layer 40 followed by a chemical etch to remove the stressor layer 30, followed by a different chemical etch to remove the plating seed layer, and/or the metal-containing adhesion layer.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:
1. A method comprising:
   providing a structure comprising:
      a spalled layer having a first side and a second side; and
      a tape layer formed on the first side of the spalled layer, wherein the tape layer is provided at below a first temperature range;
   applying a temporary substrate layer to the second side of the spalled layer,
      wherein the temporary substrate layer is applied at a second temperature range, and
      wherein at least a portion of the second temperature range is lower than the first temperature range; and
   after applying the temporary substrate layer, separating the tape layer from the spalled layer,
      wherein the step of applying the temporary substrate layer to the second side of the spalled layer comprises:

controlling a temperature of the temporary substrate layer to be within the second temperature range, wherein the second temperature range is selected to promote application of the temporary substrate layer to the second side of the spalled layer, and after controlling the temperature of the temporary substrate to be within the second temperature range, applying the temporary substrate layer to the second side of the spalled layer.

2. The method according to claim 1, wherein the tape layer exhibits a predetermined amount of wrinkling within the first temperature range.

3. The method according to claim 1, wherein the step of separating the tape layer from the spalled layer comprises:
controlling a temperature of the tape layer to be within a third temperature range,
wherein at least a portion of the third temperature range is lower than the second temperature range, and
wherein the third temperature range is selected to promote separation of the tape layer from the spalled layer; and
after controlling the temperature of the tape layer to be within the third temperature range, separating the tape layer from the spalled layer.

4. The method according to claim 1, wherein the temporary substrate layer is a metal alloy.

5. The method according to claim 4, wherein a lower limit of the second temperature range is a melting point of the metal alloy.

6. The method according to claim 1, wherein the step of providing the structure comprises providing the tape layer as a stressor layer on the first side of the spalled layer.

7. The method according to claim 6, wherein the step of providing the structure further comprises providing a handle layer on the tape layer.

8. The method according to claim 1, wherein the step of providing the structure comprises:
providing a stressor layer on the first side of the spalled layer; and
providing the tape layer as a handle layer on the stressor layer.

9. The method according to claim 8, further comprising, after separating the tape layer from the spalled layer, separating the stressor layer from the spalled layer.

10. The method according to claim 1, further comprising, after separating the tape layer from the spalled layer, bonding the second side of the spalled layer directly or indirectly to a target substrate.

11. The method according to claim 3,
wherein the tape layer comprises an adhesive layer and a tape base layer provided on the adhesive layer, and
wherein the step of providing the structure comprises providing the adhesive layer of the tape layer on the spalled layer.

12. The method according to claim 1, wherein a lower limit of the first temperature range is approximately 250 degrees Celsius.

13. The method according to claim 12,
wherein the temporary substrate layer is a metal alloy,
wherein a lower limit of the second temperature range is a melting point of the metal alloy, and
wherein the lower limit of the second temperature range is approximately 150 degrees Celsius.

14. The method according to claim 3, wherein the third temperature range is between 140 degrees Celsius and 200 degrees Celsius.

15. A method comprising:
providing a structure comprising:
a spalled layer having a first side and a second side; and
a tape layer formed on the first side of the spalled layer, wherein the tape layer is provided at below a first temperature range;
applying a temporary substrate layer to the second side of the spalled layer,
wherein the temporary substrate layer is applied at a second temperature range, wherein a lower limit of the second temperature range is approximately 130 degrees Celsius, and
wherein at least a portion of the second temperature range is lower than the first temperature range; and
after applying the temporary substrate layer, separating the tape layer from the spalled layer,
wherein the step of separating the tape layer from the spalled layer comprises:
controlling a temperature of the tape layer to be within a third temperature range,
wherein at least a portion of the third temperature range is lower than the second temperature range, and
wherein the third temperature range is selected to promote separation of the tape layer from the spalled layer.

16. A method comprising:
providing a structure comprising:
a spalled layer having a first side and a second side; and
a tape layer formed on the first side of the spalled layer, wherein the tape layer is provided at below a first temperature range, wherein a lower limit of the first temperature range is approximately 250 degrees Celsius;
applying a temporary substrate layer to the second side of the spalled layer,
wherein the temporary substrate layer is applied at a second temperature range, wherein a lower limit of the second temperature range is approximately 130 degrees Celsius, and
wherein at least a portion of the second temperature range is lower than the first temperature range; and
after applying the temporary substrate layer, separating the tape layer from the spalled layer.

* * * * *